(12) United States Patent
Forbes

(10) Patent No.: US 6,327,465 B1
(45) Date of Patent: *Dec. 4, 2001

(54) VOLTAGE TUNABLE ACTIVE INDUCTORLESS FILTER

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/204,446

(22) Filed: Dec. 2, 1998

(51) Int. Cl.$^7$ .................................................. H04B 1/10

(52) U.S. Cl. ........................ 455/307; 327/554; 330/303; 333/215

(58) Field of Search .............................. 333/215; 327/553, 327/554, 215, 219; 330/303, 305, 85, 98, 99, 100; 455/307, 313

(56) References Cited

U.S. PATENT DOCUMENTS

| | | | |
|---|---|---|---|
| 3,824,496 | * 7/1974 | Hekimian | 333/215 |
| 4,409,557 | 10/1983 | Sechi | 330/277 |
| 4,524,332 | 6/1985 | Gay | 330/294 |
| 4,760,353 | * 7/1988 | Perkins | 333/215 |
| 5,175,513 | 12/1992 | Hara | 331/115 |
| 5,184,349 | * 2/1993 | Riordan | 455/136 |
| 5,343,170 | * 8/1994 | Lee | 333/215 |
| 5,574,398 | 11/1996 | Hagino et al. | 327/557 |
| 5,726,613 | 3/1998 | Hayashi et al. | 333/214 |
| 5,834,976 | 11/1998 | Tomasini et al. | 330/292 |
| 6,081,157 | 6/2000 | Ikeda et al. | 330/107 |
| 6,107,893 | * 8/2000 | Forbes | 333/215 |
| 6,121,825 | 9/2000 | Ko et al. | 327/553 |

OTHER PUBLICATIONS

Edited by Razavi, Behzad B., AT&T Laboratories, "Monolithic Phase–Locked Loops and Clock Recovery Circuits," *IEEE Press*, 1996, p. 508.

Hara, S., and Tokumitsu, T., "Monolithic microwave active inductors and their applications," *IEEE International Symposium on Circuits and Systems*, Singapore, Jun. 11–14, 1991, Abstract No. B9210–1350H–019, (Catalog No. 91CH3006–4), p. 5, vol. xlviii+3177, pp. 1857–1860, vol. 3.

(List continued on next page.)

*Primary Examiner*—Vivian Chang
*Assistant Examiner*—Eliseo Ramos-Feliciano
(74) *Attorney, Agent, or Firm*—Dorsey & Whitney LLP

(57) ABSTRACT

A monolithic active frequency selection circuit includes an input presenting a frequency-dependent impedance and a first gain block configured to provide less than unity voltage gain, a high input impedance and a low output impedance. An output of the first amplifier is coupled to the frequency selection circuit input. The frequency selection circuit includes a first phase shifter that, in one aspect, is formed by a first capacitor coupled between the first port and a reference voltage. The frequency selection circuit also includes a second amplifier configured to provide greater than unity voltage gain. The second amplifier has an input coupled to the output of the first amplifier and an output coupled to the input of the first amplifier. The frequency selection circuit further includes a second phase shifter, which may be formed from a capacitor coupled between the output of the second amplifier and a reference voltage. The first and second amplifiers and the first and second phase shifters are coupled in a loop such that the frequency dependence of an impedance presented at the output of the first amplifier emulates the impedance of a parallel RLC tank circuit, providing a Q on the order of ten at a center frequency $\omega_o$ of several hundred megahertz. The output of the second amplifier may be used to provide a high Q, tuned transimpedance amplification function relative to the input.

12 Claims, 5 Drawing Sheets

OTHER PUBLICATIONS

Ali M. Niknejad and Robert G. Meyer, "Analysis, Design, and Optimization of Spiral Inductors and Transformers for Si RF IC's," *IEEE Journal of Solid–State Circuits* 33(10): 1470–1481, Oct. 1998.

Lawrence M. Burns, "Applications for GaAs and Silicon Integrated Circuits in Next Generation Wireless Communication Systems," *IEEE Journal of Solid–State Circuits* 30(10): 1088–1095, Oct. 1995.

Jürgen Hartung, "Integrated Passive Components in MCM–Si Technology and their Applications in RF–Systems," *1998 International Conference on Multichip Modules and High Density Packaging*, pp. 256–261.

Hitoshi Hayashi and Masahiro Muraguchi, "A Novel Broad-Band MMIC VCO Using an Active Inductor," *IEICE Trans. Fundamentals E81–A(2)*:224–229, Feb. 1998.

Donald A. Hitko et al., "A 1 V 5 mW, 1.8 GHz, Balanced Voltage–Controlled Oscillator with an Integrated Resonator," *Proceedings 1997 International Symposium on Low Power Electronics and Design*, ACM, New York, NY Aug. 18–20, 1997, pp. 46–51.

Jan Craninckx and Michiel Steyaert, "A 1.8–GHz Low-–Phase–Noise Sprial–LC CMOS VCO," *1996 Symposium on VLSI Circuits Digest of Technical Papers*, pp. 30–31.

Behzad Razavi, "A Study of Phase Noise in CMOS Oscillators," *IEEE Journal of Solid–State Circuits* 31(3):331–343, Mar. 1996.

\* cited by examiner

VOLTAGE TUNABLE ACTIVE INDUCTORLESS FILTER

TECHNICAL FIELD

The present invention relates in general to monolithic radio frequency circuits and in particular to improved monolithic voltage tunable filters.

BACKGROUND OF THE INVENTION

Wireless communications products have become high volume consumer electronics accessories and are in increasing demand for a broad variety of applications. Features that are increasingly emphasized include reduced power consumption, small form factor, light weight and portability. Many of these products operate in a frequency range extending from about one hundred megahertz to about two gigahertz. As a result, there is a demand to integrate RF receivers and transmitters into high-yield silicon integrated circuit processes to allow a combination of analog, digital and RF functions on a single integrated circuit. "Applications for GaAs and Silicon Integrated Circuits in Next Generation Wireless Communication Systems," by L. M. Burns, IEEE JSSC, Vol. 30, No. 10, Oct. 1995, pp. 1088–1095, discusses examples of monolithic radio receiver and transmitter functions.

Most radio receivers and transmitters require frequency selection components that rely on some form of oscillation to provide frequency selectivity. Devices such as crystals and SAWs that employ mechanical vibration to realize frequency selection also require hermetic packages having interior cavities in order to provide reliable and robust electrical characteristics, particularly in view of environmental hazards. Often, the package is more expensive than the component within it. Additionally, multiple packages are required, because the materials useful for these types of frequency selection components do not support active electronic devices, and vice versa. Further, devices that rely on mechanical oscillation also use materials having different packaging requirements than do active electronic devices.

Electronic circuits that do not rely on mechanical vibrations for frequency selection characteristics often rely instead on electrical resonances to provide frequency selectivity. Practical electrical resonators in this frequency range require a combination of capacitance and inductance. Of these, inductance is particularly difficult to realize in compact form together with reasonably high quality factor, or "Q." Q is often defined as the amount of energy stored divided by the amount of energy dissipated per cycle, but can also be defined as a center frequency divided by a three dB bandwidth of a frequency response. The latter definition is used herein in instances where the former is inapplicable.

Known approaches for realizing monolithic inductance include spiral inductors, transmission lines and bond wires. For example, "A 1.8 GHz Low-Phase-Noise Spiral-LC CMOS VCO," by J. Cranickx and M. Steyaert, 1996 Symp. on VLSI Cir. Dig. Tech. Papers, pp. 30–31 describes a spiral inductor approach that achieves a Q of 5.7 near two gigahertz. "Integrated Passive Components in MCM-Si Technology and their Applications in RF-Systems," by J. Hartung, 1998 Int. Conf. on Multichip Modules and High Density Packaging, IEEE Cat. No. 0-7803-4850-8/98, pp. 256–261, reports Qs and their frequency dependence for spiral inductors vs. substrate resistance, with highest Qs and self-resonant frequencies for spiral inductors fabricated on higher-resistivity substrates. A recent overview of spiral inductive components, entitled "Analysis, Design, and Optimization of Spiral Inductors and Transformers for Si RF IC's," by A. Niknejad and R. Meyer, IEEE JSSC, Vol. 33, No. 10, October 1998, pp. 1470–1481, gives examples of Qs having peak values around five and inductances of up to about ten nanoHenrys for spiral inductors fabricated on silicon.

Transmission line approaches to realizing monolithic inductance tend to be bulky and relatively lossy in this frequency range. Bond wires can provide Qs ranging from 11 to 15, as described in "A 1V, 1.8 GHz, Balanced Voltage-Controlled Oscillator with an Integrated Resonator," by D. A. Hitko et al., Proc. Symp. Low Power Electr. and Des., pp. 46–51 (1997). Bond wire inductors tend to be relatively large compared to other integrated circuit components, but do permit the surface area beneath them to be used to fabricate other integrated circuit elements prior to bond wire installation. Bond wire inductors also require bond pads, which are relatively large and which also preclude use of their area for other purposes. None of these approaches provide the combination of small form factor, high Q and packageability needed for many applications.

Another approach to providing a frequency selection function in monolithic form relies on impedance transformations that are possible with active circuits, i.e., circuits including transistors. U.S. Pat. No. 5,175,513, entitled "Oscillator Circuit Employing Inductive Circuit Formed of Field Effect Transistors" and issued to S. Hara, describes an example using MESFETs. U.S. Pat. No. 5,726,613, entitled, "Active Inductor," issued to H. Hayashi et al. and "A Novel Broad-Band MMIC VCO Using an Active Inductor," H. Hayashi and M. Maraguchi, IEICE Trans. Fundamentals, Vol. E81-A, No. 2, February 1998, pp. 224–229, describe similar approaches. While these approaches do provide compact circuits, they use GaAs MESFETs, which are not as manufacturable as CMOS FETs and which are not cost-competitive with silicon integrated circuits. Additionally, it is much more expensive to provide complex ancillary functions on GaAs substrates, such as may be realized using digital circuitry, than is the case with silicon substrates.

Therefore, there is a need for monolithic circuitry that provides frequency selection functions and that is compatible with cost-effective approaches to providing other circuit functions.

SUMMARY OF THE INVENTION

In one aspect, the present invention includes an active frequency selection circuit. The frequency selection circuit includes a first port presenting a frequency-dependent impedance and a first amplifier configured to provide nearly unity gain, a high input impedance and a low output impedance. The first amplifier has a first input and a first output. The first output is coupled to the first port. The frequency selection circuit includes a first phase shifter that, in one aspect, is formed by a first capacitor coupled between the first port and a reference voltage. The frequency selection circuit also includes a second amplifier configured to provide greater than unity voltage gain, a high input impedance and a low output impedance. The second amplifier has a second input coupled to the first output and a second output coupled to the first input through a second phase shifter. In one aspect, the second phase shifter is formed from a second capacitor coupled between the second output and a reference voltage. The first and second amplifiers and the first and second phase shifters are coupled in a loop such that the frequency dependence of an impedance presented at the output of the first amplifier emulates the impedance of a parallel RLC tank circuit. The circuit is expected to provide a Q of greater than fifty at a center frequency $\omega_o$ of about five hundred megahertz. Significantly, the active frequency selection circuit may be formed as a monolithic CMOS or a BiCMOS integrated circuit. As a result, the active frequency selection circuit may be combined with other kinds of circuits, such as signal processors and digital circuits.

Voltage dependent values for parasitic impedances and admittances of the first and second amplifiers cause the center frequency $\omega_o$ to vary linearly with supply voltage. As a result, the center frequency $\omega_o$ can be swept over a range of tens or hundreds of megahertz by altering the supply voltage.

In another aspect, the frequency selection circuit forms a tuned transimpedance amplifier, with a second port coupled to the second output of the second amplifier. The second port forms an output for the transimpedance amplifier. The center frequency $\omega_o$ of the tuned transimpedance amplifier also may be varied simply by varying the supply voltage.

DETAILED DESCRIPTION OF THE INVENTION

Figure 1:
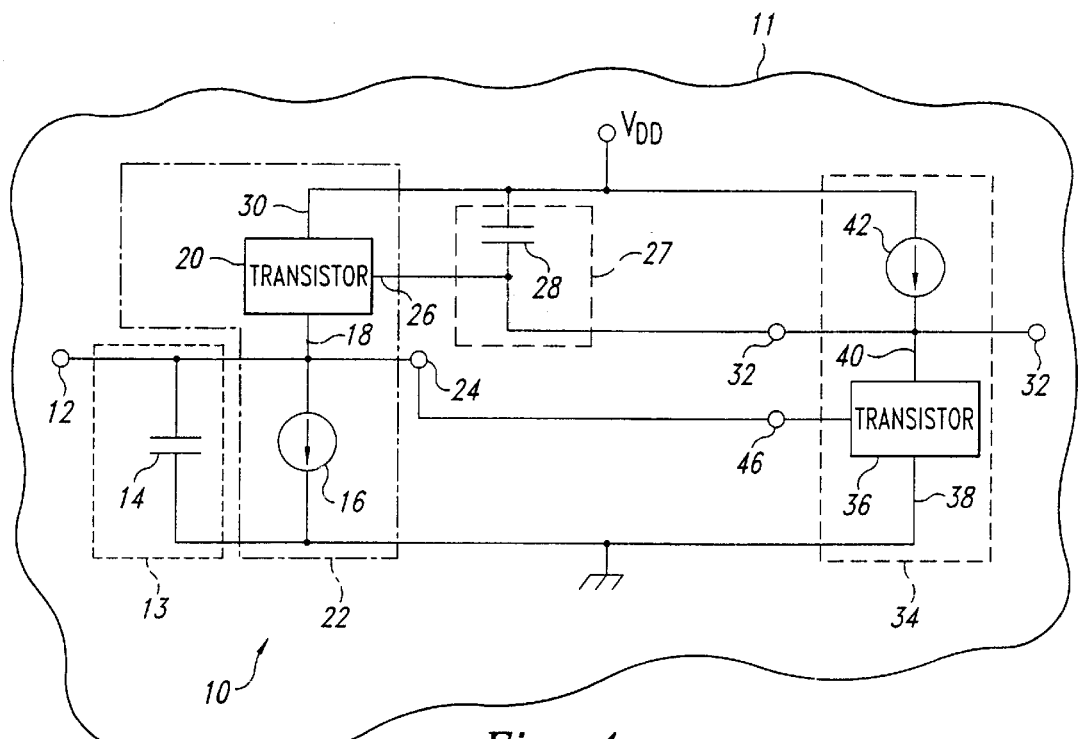
FIG. 1 is a simplified schematic diagram of an inductorless, voltage-tunable filter circuit, in accordance with an embodiment of the present invention.

FIG. 1 is a simplified schematic diagram of an inductorless, voltage-tunable filter circuit 10 constructed on a substrate 11, in accordance with an embodiment of the present invention. The filter circuit 10 includes an input 12 coupled to a first phase shift network 13. In one embodiment, the first phase shift network 13 is formed from a first capacitor 14 having a first capacitance $C_1$ coupled in shunt with the input 12. The filter circuit 10 also includes a first current source 16 coupled to a first current-carrying electrode 18 of a first transistor 20 forming a first amplifier 22. In one embodiment, the first transistor 20 is a FET configured as a source follower amplifier. In another embodiment, the first transistor 20 is a bipolar transistor configured as an emitter follower amplifier. In either case, the first amplifier 22 provides a voltage gain at an amplifier output 24 of nearly unity, together with high input impedance and relatively low output impedance. The output 24 of the first amplifier 22 is also coupled to the input 12 to the filter circuit 10.

The first transistor 20 has a control electrode 26 coupled to a second phase shift network 27. In one embodiment, the second phase shift network 27 is formed from a second capacitor 28 having a second capacitance $C_2$. The first transistor 20 has a second current-carrying electrode 30 coupled to a voltage source $V_{DD}$. The control electrode 26 is coupled to an output 32 of a second amplifier 34. In one embodiment, the second amplifier 34 is a common source FET amplifier. In another embodiment, the second amplifier 34 is a common emitter amplifier. The second amplifier 34 is formed from a second transistor 36 having a first current-carrying electrode 38 that is grounded and a second current-carrying electrode 40 coupled through a second current source 42 to the voltage source $V_{DD}$. The second transistor 36 has a control electrode 44 forming an input 46 to the second amplifier 34. The control electrode 44 is also coupled to the output 24 of the first amplifier 22.

In one embodiment, the first and second capacitors 14 and 28 are thin-film capacitors. In another embodiment, the first and second capacitors 14 and 28 are MOS capacitors, i.e., with one plate of the capacitor 14 or 28 formed as a metallic or polysilicon contact on a dielectric, such as a gate oxide, and the other plate of the capacitor 14 or 18 formed as an inversion layer of minority charge carriers in semiconducting material on another side of the dielectric.

Figure 2:
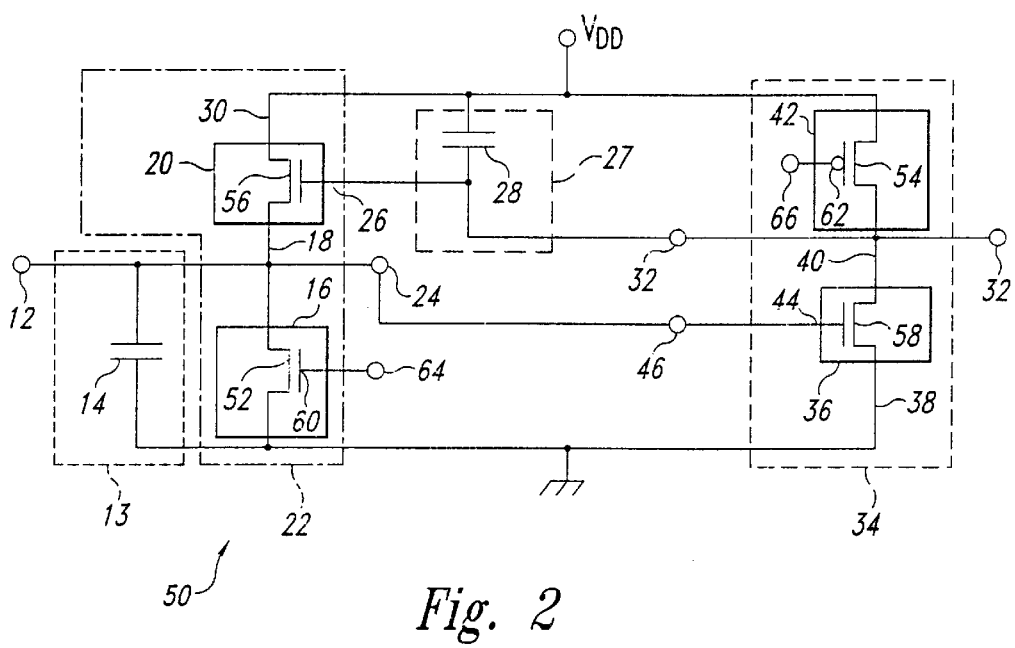
FIG. 2 is a simplified schematic diagram of the inductorless filter circuit of FIG. 1, showing FETs to realize the current sources and active elements of the circuit of FIG. 1, in accordance with an embodiment of the present invention.

FIG. 2 is a simplified schematic diagram of a filter circuit 50 in accordance with the embodiment of the inductorless filter circuit 10 of FIG. 1.

The filter circuit 50 uses FETs 52 and 54 to realize the first and second current sources 16 and 42, and FETs 56 and 58 to realize the first and second transistors 20 and 36, respectively, of the circuit 10 of FIG. 1. Many of the components used in the embodiment of the circuit 50 of FIG. 2 are identical to components used in the embodiment of the circuit 10 of FIG. 1. Therefore, in the interest of brevity, these components have been provided with the same reference numerals, and an explanation of them will not be repeated.

For the filter circuit 50 of FIG. 2 where the first 20 and second 36 transistors of FIG. 1 are FETs 56, 58 having transconductances $gm_1$ and $gm_2$, respectively, circuit analysis shows that, to first order, the filter circuit 50 has a center frequency $\omega_o$:

$$\omega_o = ((gm_1 gm_2)/(C_1 C_2))^{0.5}, \quad (1)$$

and a quality factor Q:

$$Q = ((C_1 gm_2)/(C_2 gm_1))^{0.5}, \quad (2)$$

when parasitic conductances and capacitances associated with the first 56 and 20 second 58 FETs are ignored (i.e., $G_{DS}$, $C_{GS}$ etc.). The ratio of the center frequency $\omega_o$ to the Q gives the bandwidth B of the circuit as $$B = \omega_o/Q = gm_1/C_2. \quad (3)$$

In one embodiment, the transconductance $gm_1$ of the FET 56 is $5.2 \times 10^{-5}$ Siemens, corresponding to a gate width of 1 micron, and the transconductance $gm_2$ of the FET 58 is $5 \times 10^{-3}$ Siemens, corresponding to a gate width of 100 microns. When these parameters are coupled with values of $C_1 = 1$ picoFarad for the first capacitor 14 and $C_2 = 30$ femto-Farads for the second capacitor 28, a center frequency $\omega_o$ of 468 megahertz is realized together with a Q of 57, corresponding to a bandwidth B of about 10 megahertz. In many situations, a Q of greater than ten is desirable and a Q of greater than 20 or 25 may be extremely desirable. In general, achieving Qs in this range requires that the transconductance $gm_1$ of the FET 56 be less than one-tenth of the transconductance $gm_2$ of the FET 58 and preferably substantially less than one-tenth of the transconductance $gm_2$.

In one embodiment, the FET 52 is an NMOS FET having the same gate width as an NMOS FET forming the FET 56, while the FET 54 is a PMOS FET having the same channel width as an NMOS FET forming the FET 58. For simplicity it is assumed the NMOS and PMOS have identical transistor characteristics. In some embodiments, the FETs 52 and 54 have their gates 60 and 62 coupled to bias voltages at nodes 64 and 66, respectively. The bias voltages at nodes 64 and 66 may be provided by any conventional voltage source. Current sources 16 and 38 are preferred to supply current to the transistors 20 and 36, rather than, for example, resistors, because a higher effective RF impedance is provided together with a relatively low supply voltage. In one embodiment, the circuit 10 of FIG. 1 or the circuit 50 of FIG. 2 is formed using a conventional CMOS process. In another embodiment, the circuit 10 of FIG. 1 or the circuit 50 of FIG. 2 is formed using a conventional BiCMOS process.

Figure 3:
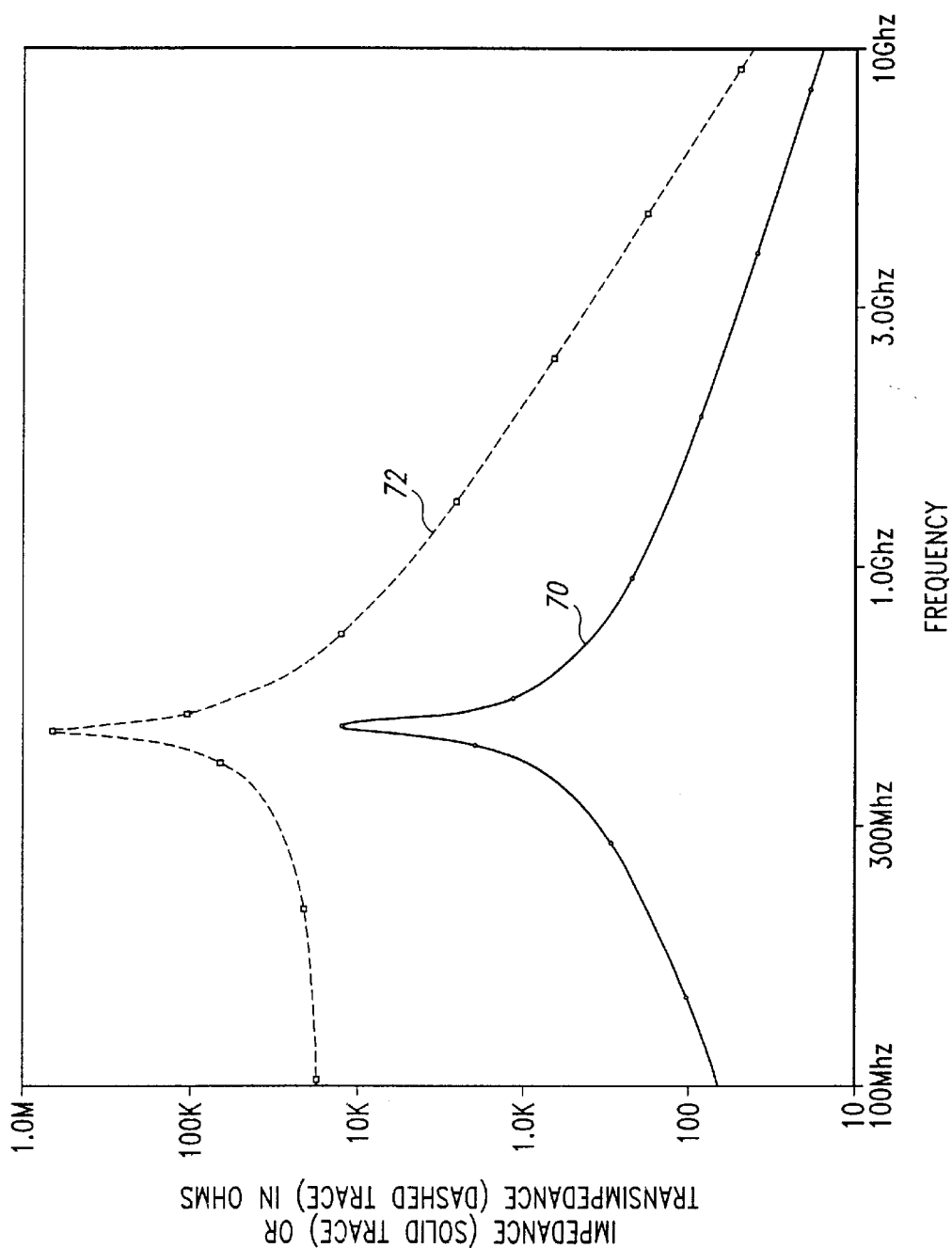
FIG. 3 is a graph of simulated input impedance and transimpedance for the filter circuit of FIG. 2, in accordance with an embodiment of the present invention.
Figure 4:
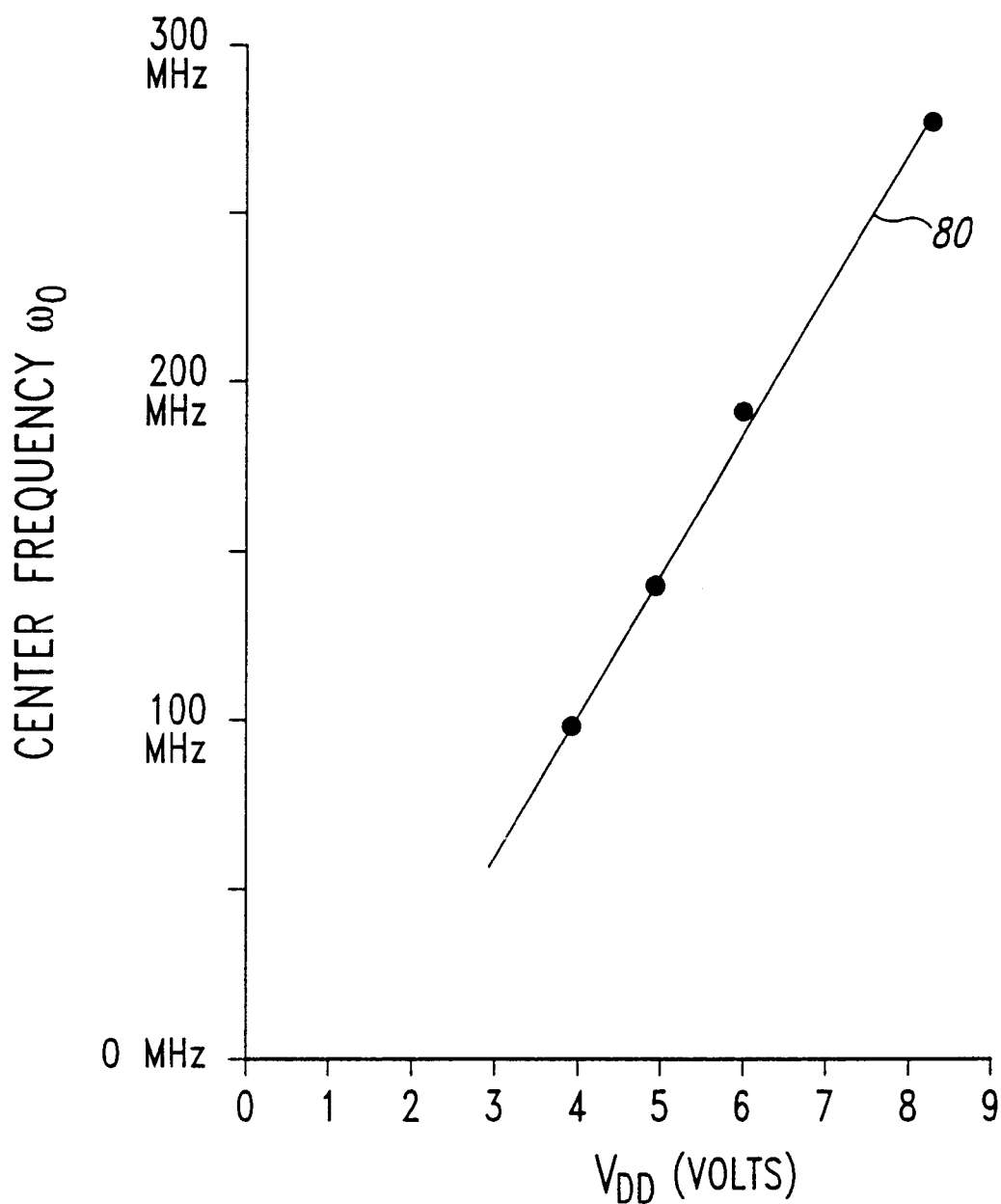
FIG. 4 is a graph showing simulated center frequency $\omega_o$ versus power supply voltage for the circuit of FIG. 2, in accordance with an embodiment of the present invention.

FIG. 3 is a graph of input impedance 70 (solid trace) and transimpedance 72 (dashed trace), and FIG. 4 is a graph showing a trace 80 representing center frequency $\omega_o$ versus power supply voltage $V_{DD}$, for the circuit 50 of FIG. 2, in accordance with an embodiment of the present invention.

The source follower amplifier 22 of FIG. 2 is expected to have an input impedance associated with the input 12 having a value of $1/gm_1$ at the resonance frequency $\omega_o$ corresponding to the peak in the solid trace 70 of FIG. 3. The impedance at the input 12 generally behaves much like a parallel RLC tank circuit and may be employed in an analogous fashion in a receiver or transmitter circuit, as is discussed below with reference to FIG. 7. The filter circuit 50 of FIG. 2 may also be used as a transimpedance amplifier having the input 12 as an input port and using the port 32 that is coupled to the drain 40 of the second FET 36 as an output, corresponding to the dashed trace 72 of FIG. 3. The upper trace 72 of FIG. 3 describes frequency dependence of an output voltage at the drain 40 of the second FET 36 divided by input current at the input 12. A series of such gain stages 10 or 50 may be employed as a voltage-tunable RF amplifier chain in a TRF (tuned radio frequency) receiver or transmitter section. The trace 80 of FIG. 4 shows a linear dependence of center frequency $\omega_o$ on supply voltage $V_{DD}$, with a sweep rate of about 50 megahertz per volt, and also shows a broad range of frequencies over which the circuit 50 may be tuned. It will be appreciated that other frequency ranges may be realized by altering values for components in the circuit 50.

Figure 5:
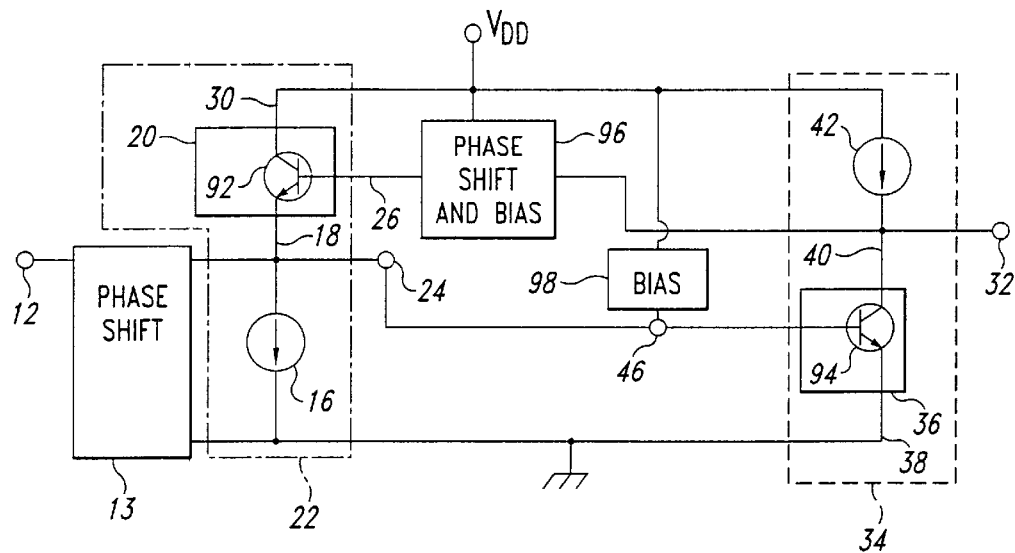
FIG. 5 is a simplified schematic diagram of another embodiment of an inductorless, voltage-tunable filter circuit, in accordance with an embodiment of the present invention.

FIG. 5 is a simplified schematic diagram of another embodiment of an inductorless, voltage-tunable filter circuit 90, in accordance with the present invention. The filter circuit 90 includes bipolar transistors 92 and 94 as the first 20 and second 36 transistors of FIG. 1, and may employ bipolar transistors or FETs to provide the first and second current sources 16 and 42. When the first transistor 20 is a bipolar transistor, a base bias current must be supplied to the control electrode 26. In one embodiment, a phase shift network 96 includes a bias source, such as a high value resistor or other conventional bias source. Similarly, when the second transistor 36 is a bipolar transistor 94, a base bias current must be supplied. In one embodiment, the base bias current is supplied through a conventional bias network 98, such as a resistor. The circuit 90 may be fabricated using a conventional BiCMOS process in one embodiment.

Figure 6:
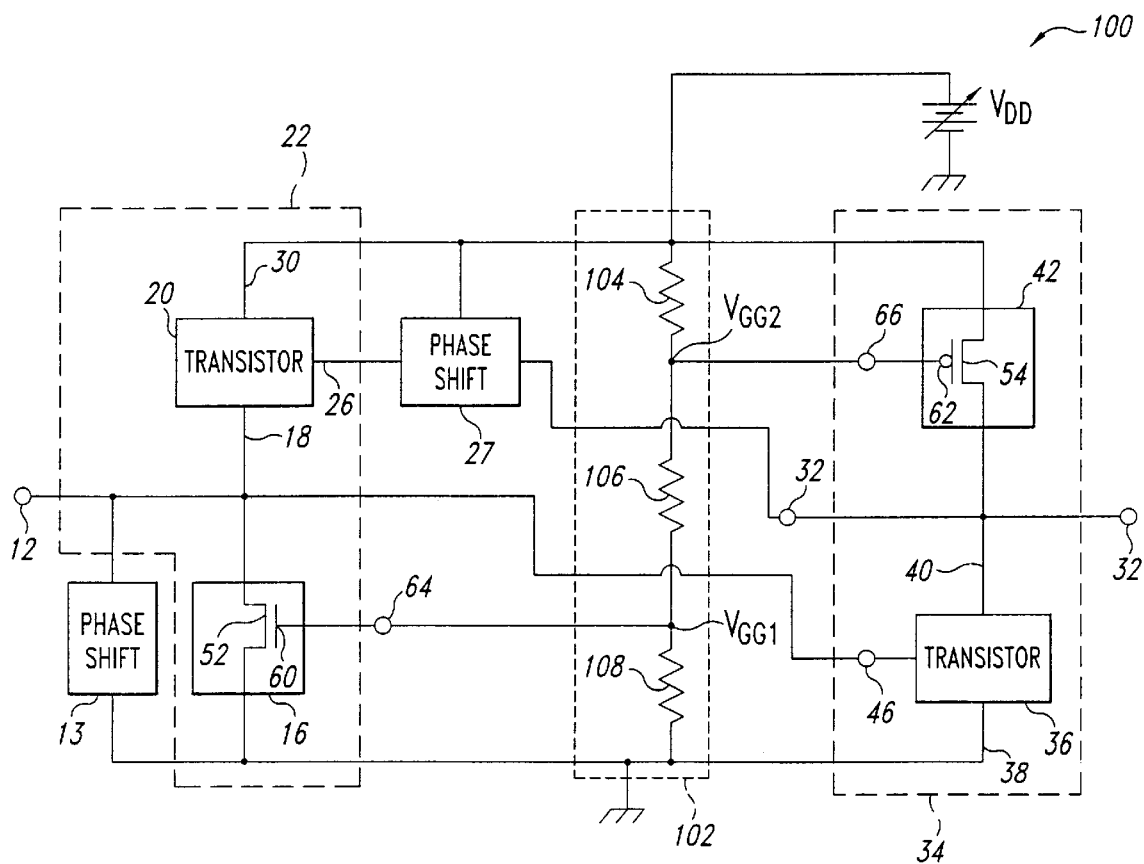
FIG. 6 is a simplified schematic diagram of a self-biasing filter circuit that is an embodiment of the filter circuit of FIG. 2, in accordance with an embodiment of the present invention.

FIG. 6 is a simplified schematic diagram of an embodiment of a self-biasing filter circuit 100 according to the embodiment of the filter circuit 50 of FIG. 2. The self-biasing filter circuit 100 employs a resistive divider network 102 to provide a pair of gate bias voltages $V_{GG1}$ and $V_{GG2}$ that maintain a fixed ratio as the power supply voltage $V_{DD}$ is varied to tune the center frequency $\omega_o$. The resistive divider network 102 includes a first resistor 104 having a first terminal coupled to a variable supply voltage $V_{DD}$ and a second terminal coupled to the gate 62 of the FET 54 forming the second current source 42. A second resistor 106 has a first terminal coupled to the second terminal of the first resistor 104 and a second terminal coupled to the gate 60 of the FET 52 forming the first current source 16. A third resistor 108 has a first electrode coupled to the second electrode of the second resistor 106 and a second electrode coupled to ground.

As a result, the ratio of the gate bias voltage $V_{GG1}$ on the FET 52 to the gate bias voltage $V_{GG2}$ on the FET 54 is constant with changing $V_{DD}$. In turn, the currents through the other transistors 20 and 36 vary together as $V_{DD}$ changes.

As a result, a simple circuit 100 is realized that provides a center frequency $\omega_o$ that may be varied over a relatively broad frequency range in response to a simple voltage change. The circuit 100 lends itself to monolithic fabrication, allowing it to be formed on an integrated circuit that is also able to support logic and other functions.

Figure 7:
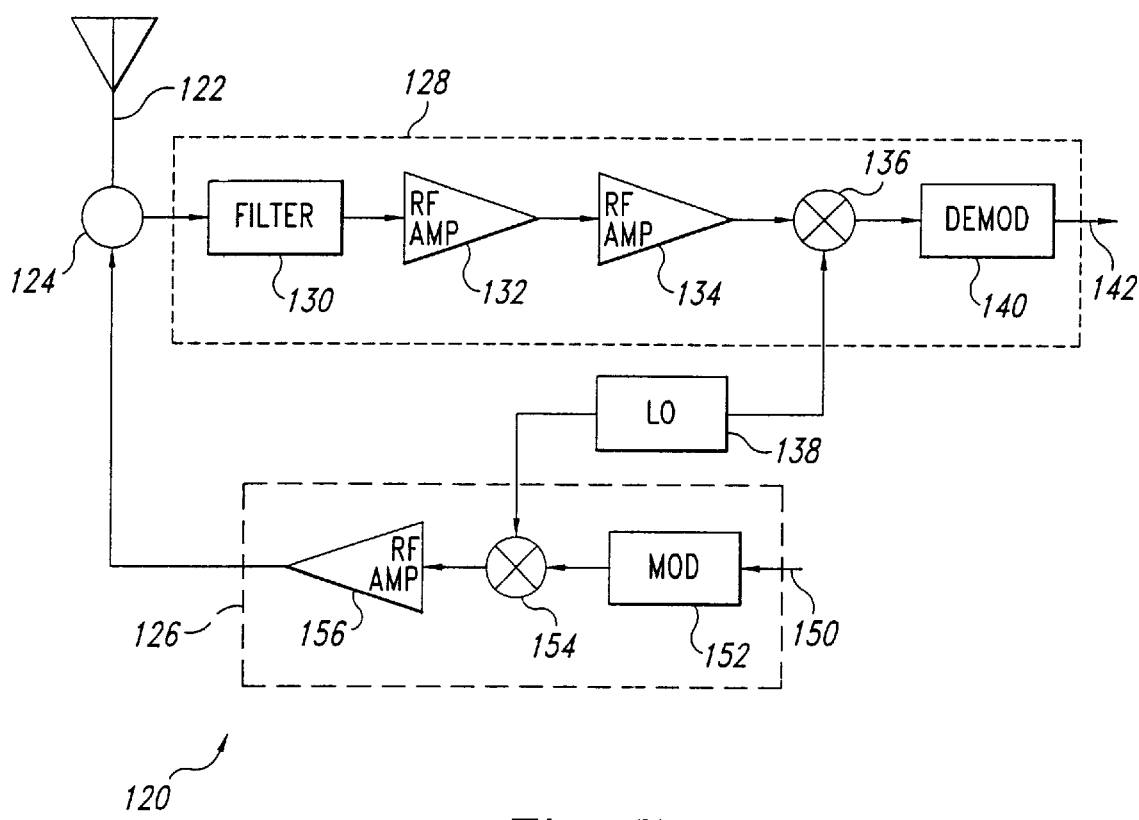
FIG. 7 is a simplified block diagram of a radio including tuned circuits using the circuits of FIGS. 1, 2, 5 or 6, in accordance with an embodiment of the present invention.

FIG. 7 is a simplified block diagram of a radio 120 including tuned RF amplifiers and/or filters using the circuits 10, 50, 90 or 100 of FIGS. 1, 2, 5 or 6, respectively, in accordance with embodiments of the present invention. The radio 120 includes an antenna 122 for transmitting and receiving signals. The antenna 122 is coupled to an optional T/R switch or duplexer 124 that may be needed to separate signals originating in an optional transmitter section 126 from signals intended for a receiver section 128. The receiver section 128 may include an optional filter 130 that accepts RF input signals from the antenna 122 and typically includes one or more radio frequency amplifiers 132, 134 (marked "RF AMP" in FIG. 7) coupled in series. A mixer 136 mixes signals from the amplifiers RF AMP 132, 134 with signals from a local oscillator LO 138 to provide baseband or IF signals that are then processed and demodulated by a signal processor DEMOD 140 to provide an output signal at an output 142. The signal at the output 142 may be an IF signal, a visual or audible annunciation, for example when the receiver section 128 forms a portion of a paging device or portable telephone, or may be digital data or voice signals in other applications.

In those applications where the transmitter section 126 is also a portion of the radio 120, input data from an input 150 is processed in a signal processor MOD 152 that typically includes a modulator and that may include other functions. An output signal from the signal processor MOD 152 is mixed with a signal from the local oscillator LO 138 in a mixer 154 to provide radio frequency signals. The radio frequency signals are typically amplified in a radio frequency amplifier RF AMP 156 and are routed to the antenna 122 for transmission.

In the radio 120, the optional filter 130 may be a conventional passive filter or may be any of the circuits 10, 50, 90 or 100 of FIGS. 1, 2, 4 or 6, respectively. In some applications, a passive filter offers intermodulation advantages, while in others, noise figure is a dominating concern, requiring a low noise gain block coupled to the antenna 122. The radio frequency amplifiers RF AMP 132, 134, 156 may be conventional RF amplifiers that are tuned by having the input 12 (FIGS. 1, 2, 4, 6) coupled to the signal path or may be transimpedance amplifiers having inputs 12 and outputs 32. Either topology may be employed to provide a tuned radio frequency amplifier chain. In either topology, independent control of the supply voltages allows independent adjustment of the center frequencies of the radio frequency amplifiers RF AMP 132, 134, 156.

In some embodiments, a conventional digital-to-analog converter (not illustrated) may be employed to supply the variable supply voltage $V_{DD}$ under control of a conventional microprocessor (not illustrated). This allows the center frequency $\omega_o$ to be set in response to external commands or in response to variables sensed within the system containing the circuits 10, 50, 90 or 100 or the radio 120.

An advantage to radios 120 using the circuits 10, 50, 90 or 100 is that many, if not all, of the functions of the radio 120 may be realized through one or more integrated circuits. As a result, the radio 120 may be manufactured using less labor together with improved footprint, reduced weight, greater reliability and reduced power consumption, and in a very compact package. The radio 120 may also be combined with other functional blocks in a single integrated circuit.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An active frequency selection circuit comprising:
   a first port having a frequency-dependent input impedance;
   a first amplifier configured to provide nearly unity gain, a high input impedance and a low output impedance, the first amplifier having a first input and a first output, the first output coupled to the first port;
   a first capacitor coupled between the first port and a first reference voltage;
   a second amplifier configured to provide greater than unity voltage gain, the second amplifier having a second input coupled to the first output and a second output coupled to the first input; and
   a second capacitor coupled between the second output and a second reference voltage.

2. The circuit of claim 1 wherein the first amplifier is a source follower amplifier and the second amplifier is a common source amplifier.

3. The circuit of claim 1 wherein the first amplifier includes a first transistor having a first power electrode coupled to a power supply, a second power electrode coupled to a first current source and to the first output and a control electrode coupled to the first input, and the second amplifier includes a second transistor having a first power electrode coupled to ground, a second power electrode coupled to a second current source and to the second output and a control electrode coupled to the second input, and the first and second current sources are formed from transistors.

4. The circuit of claim 1 wherein the first and second amplifiers are formed on a single CMOS integrated circuit.

5. The circuit of claim 1 wherein the first and second amplifiers are formed on a single BiCMOS integrated circuit.

6. The circuit of claim 1 wherein the first and second amplifiers are formed on a single integrated circuit.

7. The circuit of claim 1 wherein the first amplifier includes a first transistor having a first transconductance, the second amplifier includes a second transistor having a second transconductance and the first transconductance is about one one-hundredth of the second transconductance.

8. The circuit of claim 1, further comprising a second port coupled to the second output, the first port forming a filter input and the second port forming a filter output.

9. The circuit of claim 1 wherein a center frequency of the circuit varies with supply voltage.

10. The circuit of claim 1 wherein the first and second capacitors are thin-film capacitors.

11. The circuit of claim 1 wherein the first and second capacitors are MOS capacitors.

12. A monolithic radio frequency circuit comprising:
   an RF input;
   a RF amplifier including a voltage-tunable frequency selection component and an RF amplifier output, the RF amplifier comprising;
      a first port presenting a frequency-dependent impedance coupled to the RF input;
      a first amplifier configured to provide nearly unity gain, a high input impedance and a low output impedance, the first amplifier having a first input and a first output, the first output coupled to the first port;
      a first capacitor coupled between the first port and a reference voltage;
      a second amplifier configured to provide greater than unity voltage gain, the second amplifier having a second input coupled to the first output and a second output coupled to the first input, the second output being coupled to the RF amplifier output; and
      a second capacitor coupled between the second output and a reference voltage;
   a mixer having a first input coupled to the output of the RF amplifier;
   a local oscillator having an output coupled to a second input to the mixer; and
   a baseband signal processor having an input coupled to an output of the mixer and having an output coupled to a user interface.

* * * * *